(12) United States Patent
Takiba et al.

(10) Patent No.: US 6,762,460 B2
(45) Date of Patent: Jul. 13, 2004

(54) PROTECTION CIRCUIT PROVIDED IN SEMICONDUCTOR CIRCUIT

(75) Inventors: Akira Takiba, Kawasaki (JP); Masanori Kinugasa, Yokohama (JP); Yoshimitsu Itoh, Kawasaki (JP); Masaru Mizuta, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/983,124

(22) Filed: Oct. 23, 2001

(65) Prior Publication Data

US 2002/0053697 A1 May 9, 2002

(30) Foreign Application Priority Data

Oct. 24, 2000 (JP) ........................................ 2000-324190

(51) Int. Cl.$^7$ .............................................. H01L 23/62
(52) U.S. Cl. ........................ 257/355; 257/173; 257/356; 257/357; 257/360; 257/361; 257/362; 257/363; 361/111
(58) Field of Search .......................... 257/173, 336–339, 257/355–357, 360–363, 371; 361/56, 91.1, 111, 118, 127

(56) References Cited

U.S. PATENT DOCUMENTS

| 4,044,313 | A | * | 8/1977 | Wittlinger et al. | ........ | 330/207 P |
| 5,698,886 | A | * | 12/1997 | Thenoz et al. | ............... | 257/355 |
| 5,751,525 | A | * | 5/1998 | Olney | .......................... | 361/56 |
| 5,760,630 | A | | 6/1998 | Okamoto | | |
| 6,043,538 | A | * | 3/2000 | Allen et al. | .................. | 257/355 |
| 6,054,736 | A | | 4/2000 | Shigehara et al. | | |
| 6,455,895 | B1 | * | 9/2002 | Morishita | .................... | 257/355 |

FOREIGN PATENT DOCUMENTS

| JP | 8-222643 | 8/1996 |
| JP | 9-326685 | 12/1997 |

OTHER PUBLICATIONS

Sze, S.M., "Physics of Semiconductor Devices", John Wily & Sons, Second Edition, 1981, pp. 453–456.*
Wolf, S, "Silicon Processing for the VLSI Era", vol. 2—Process Integration, Lattice Press 1990, pp. 298–300.*

* cited by examiner

Primary Examiner—Nathan J. Flynn
Assistant Examiner—Johannes Mondt
(74) Attorney, Agent, or Firm—Oblon, Spivak, McClelland, Maier & Neustadt, P.C.

(57) ABSTRACT

A protection circuit including a power supply terminal supplied with a power supply potential, a reference terminal supplied with a reference potential, and a first p-channel MOS transistor having a first gate, a first source, a first drain and a first back gate. The first gate, the first source and the first back gate are connected to the power supply terminal. Also included is a second p-channel MOS transistor having a second gate, a second source, a second drain and the first back gate, in which the second source of the second p-channel MOS transistor is connected to the first drain of the first p-channel MOS transistor, and the second gate and the second drain of the second p-channel MOS transistor is connected to the reference terminal. The circuit also includes a first n-channel MOS transistor having a third gate, a third source, a third drain and a second back gate, in which the third gate, in which the third source and the second back gate of the first n-channel MOS transistor are connected to the reference terminal, and including a second n-channel MOS transistor having a fourth gate, a fourth source, a fourth drain and the second back gate, in which the fourth source of the second n-channel MOS transistor are connected to the third drain of the first n-channel MOS transistor, and the fourth gate and the fourth drain of the second n-channel MOS transistor are connected to the power supply terminal.

9 Claims, 6 Drawing Sheets

Prior Art

FIG. 1A

Prior Art

FIG. 1B

Prior Art

PROTECTION CIRCUIT PROVIDED IN SEMICONDUCTOR CIRCUIT

CROSS-REFERENCE TO RELATED APPLICATIONS

This application is based upon and claims the benefit of priority from the prior Japanese Patent Application No. 2000-324190, filed Oct. 24, 2000, the entire contents of which are incorporated herein by reference.

BACKGROUND OF THE INVENTION

1. Field of the Invention

This invention relates to a protection circuit provided in a semiconductor circuit, and more particularly, to a protection circuit for protecting a semiconductor circuit from being broken by static electricity.

2. Description of the Related Art

Conventionally, various protection circuits for countermeasures to static electricity have been typically added to terminals of semiconductor circuits (hereinafter denoted "IC") for obviating the ICs from breakage due to the static electricity. Recently, internal circuits tend to be increasingly broken by static electricity applied to an input terminal or an output terminal, which introduces into a power supply terminal supplied with a power supply potential Vcc or a ground terminal (or a reference terminal) supplied with a ground potential (or a reference potential).

For example, in the prior art, a protection circuit formed of MOS elements is arranged between a power supply terminal and a ground terminal for conducting a charge generated by static electricity, which has introduced into the power supply terminal, to the ground terminal.

The conventional protection circuit will be described below with reference to FIGS. 1A to 1C.

Figure 1A:
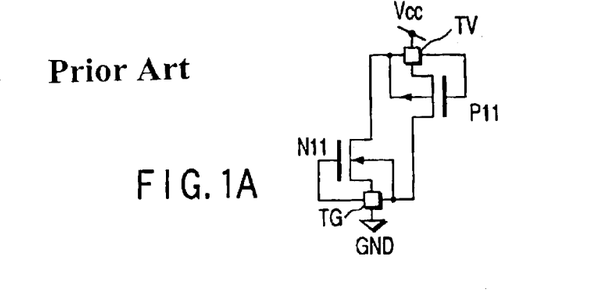
FIG. 1A is a circuit diagram illustrating the configuration of a conventional protection circuit.

FIG. 1A is a circuit diagram illustrating the configuration of the conventional protection circuit; FIG. 1B is a schematic cross-sectional view of the protection circuit; and FIG. 1C illustrates a layout of the protection circuit on a semiconductor substrate.

As illustrated in FIG. 1A, this protection circuit comprises a p-channel MOS transistor (hereinafter denoted "p-MOS transistor") P11, and an n-channel MOS transistor (hereinafter denoted "n-MOS transistor") N11.

The p-MOS transistor P11 has a source, a gate and a back gate connected to a power supply terminal TV which is supplied with a power supply potential Vcc. The n-MOS transistor N11 has a drain connected to a power supply terminal TV, and a source, a gate and a back gate connected to a ground terminal TG supplied with a ground potential GND. Further, the p-MOS transistor P11 has a drain connected to the ground terminal TG.

Figure 1B:
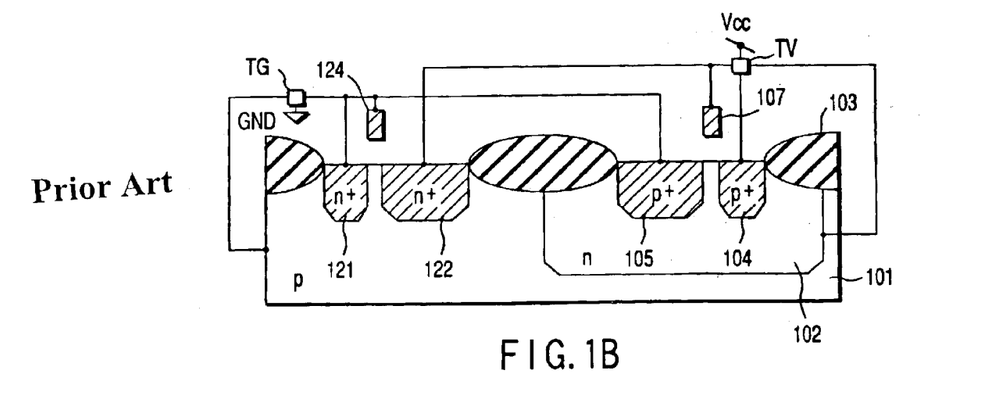
FIG. 1B is a schematic cross-sectional view of the conventional protection circuit.

A general structure of the protection circuit in cross-section is as illustrated in FIG. 1B. An n-type well 102 is formed within a p-type silicon semiconductor substrate 101, and an element region separated by an element separation insulating film 103 is formed in the n-type well 102. A source region (p$^+$-type) 104 and a drain region (p$^+$-type) 105 are formed in the n-type well 102 of the element region. A gate electrode 107 is placed on a channel between the source region 104 and the drain region 105, with a gate insulating film (not shown) therebetween. The p-MOS transistor P11 is formed of these components.

Also, a source region (n$^+$-type) 121 and a drain region (n$^+$-type) 122 are formed within the p-type semiconductor substrate 101. A gate electrode 124 is placed on a channel between the source region 121 and the drain region 122, with a gate insulating film (not shown) therebetween. The n-MOS transistor N11 is formed of these components.

The power supply terminal TV is connected to the source region 104, gate electrode 107 and n-type well 102 of the p-MOS transistor P11. The n-MOS transistor N11 has the drain region 122 connected to the power supply terminal TV, and the source region 121, gate electrode 124 and p-type semiconductor substrate 101 connected to the ground terminal TG. Also, the p-MOS transistor P11 has the drain region 105 connected to the ground terminal TG.

Figure 1C:
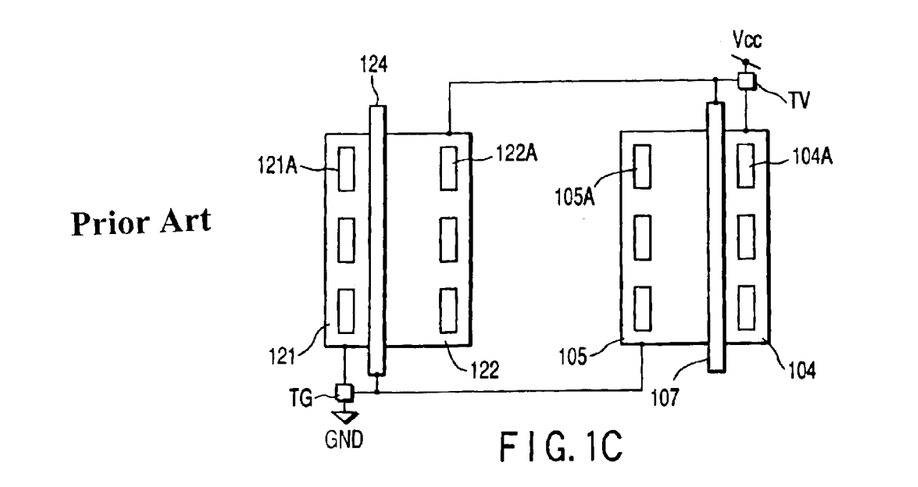
FIG. 1C illustrates a layout of the conventional protection circuit on a semiconductor substrate.

The protection circuit is laid out on the semiconductor substrate as illustrated in FIG. 1C. The source region 104 and drain region 105, which comprise the p-MOS transistor P11, are separately positioned. The gate electrode 107 is arranged between the source region 104 and drain region 105. A source contact 104A is placed in the source region 104, while a drain contact 105A is placed in the drain region 105. The distance between the drain contact 105A and gate electrode 107 is longer than the distance between the source contact 104A and gate electrode 107.

On the other hand, the source region 121 and drain region 122, which comprise the n-MOS transistor N11, are separately positioned. The gate electrode 124 is arranged between the source region 121 and drain region 122. A source contact 121A is placed in the source region 121, while a drain contact 122A is placed in the drain region 122. The distance between the drain contact 122A and gate electrode 124 is longer than the distance between the source contact 121A and gate electrode 124.

However, even though the foregoing protection circuit is added between the power supply terminal TV and ground terminal TG of the semiconductor circuit, internal elements within the semiconductor circuit are still broken frequently. Therefore, electrostatically broken locations are necessarily analyzed in conventional semiconductor circuits to make a different modification to each product.

BRIEF SUMMARY OF THE INVENTION

According to an aspect of the present invention, there is provided a protection circuit comprises a power supply terminal supplied with a power supply potential, a reference terminal supplied with a reference potential, a first p-channel MOS transistor having a gate, a source, a drain and a back gate, wherein the gate, the source and the back gate are connected to the power supply terminal, a second p-channel MOS transistor having a gate, a source, a drain and a back gate, wherein the source is connected to the drain of the first p-channel MOS transistor, the back gate is connected to the power supply terminal, and the gate and the drain are connected to the reference terminal, a first n-channel MOS transistor having a gate, a source, a drain and a back gate, wherein the gate, the source and the back gate are connected to the reference terminal, and a second n-channel MOS transistor having a gate, a source, a drain and a back gate, wherein the source is connected to the drain of the first n-channel NOS transistor, the back gate is connected to the reference terminal, and the gate and the drain being connected to the power supply terminal.

DETAILED DESCRIPTION OF THE INVENTION

Certain terminology used in the following description is for convenience only and is not limiting. The term "back gate" as used herein refers to a p-type substrate (or p-type well region) under the channel in an n-MOS transistor, or an n-type well region (or n-type substrate) under the channel in a p-MOS transistor. In the following, embodiments of this invention will be described with reference to the accompanying drawings.

First Embodiment

Described first will be p-channel MOS transistors (hereinafter denoted "p-MOS transistor") and n-channel MOS transistors (hereinafter denoted "n-MOS transistor") which comprise a protection circuit according to a first embodiment of this invention.

Figure 2A:
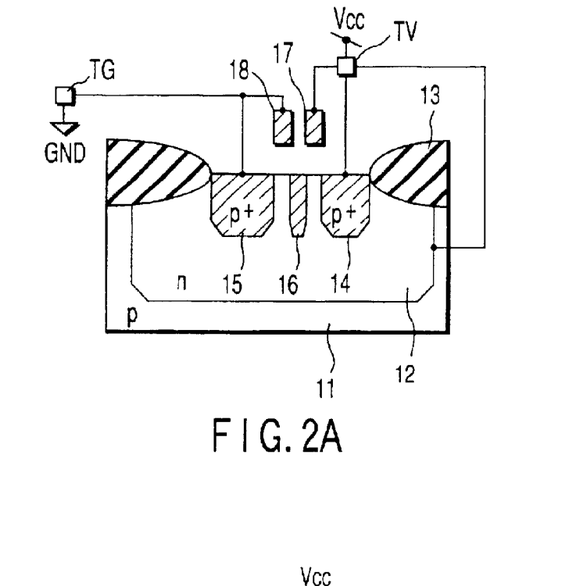
FIG. 2A is a schematic cross-sectional view of p-channel MOS transistors which form part of a protection circuit according to a first embodiment of this invention.
Figure 2B:
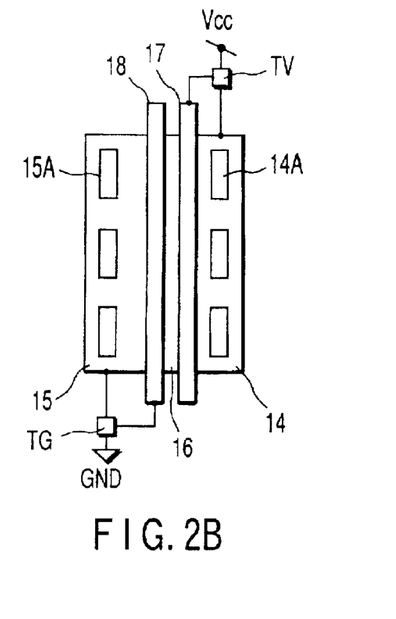
FIG. 2B illustrates a layout of the p-channel MOS transistors, forming part of the protection circuit according to the first embodiment, on a semiconductor substrate.

FIG. 2A is a schematic cross-sectional view of the p-channel MOS transistors which form part of the protection circuit according to the first embodiment. FIG. 2B illustrates a layout of the p-channel MOS transistors on a semiconductor substrate.

As illustrated in FIG. 2A, an n-type well 12 is formed within a p-type silicon semiconductor substrate 11, and an element region is formed in the n-type well 12 and separated by an element separation insulating film 13. Formed within the n-type well 12 of this element region are a source region ($p^+$-type) 14 and a drain region ($p^+$-type) 15 spaced apart by a predetermined distance. An island region ($p^+$-type) 16 separated from these source region 14 and drain region 15 is formed between the source region 14 and drain region 15.

A gate electrode 17 is formed on a channel between the source region 14 and island region 16, with a gate insulating film (not shown) therebetween. A gate electrode 18 is formed on a channel between the island region 16 and drain region 15, with a gate insulating film (not shown) therebetween.

A p-MOS transistor P1 is formed of the foregoing source region 14, island region 16, channel between these source region 14 and island region 16, and gate electrode 17 on the channel. Also, a p-MOS transistor P2 is formed of the island region 16, drain region 15, channel between these island region 16 and drain region 15, and gate electrode 18 on the channel.

A power supply terminal TV, supplied with a power supply potential Vcc, is connected to the source region 14, gate electrode 17 and n-type well 12 of the p-MOS transistor P1. A ground terminal (or a reference terminal) TG, supplied with a ground potential GND (or a reference potential), is connected to the drain region 15 and gate electrode 18 of the p-MOS transistor P2.

The p-channel MOS transistors P1, P2 are laid out on a semiconductor substrate as illustrated in FIG. 2B. The source region 14, island region 16 and drain region 15, comprising the p-MOS transistors P1, P2, are positioned separately from one another. The gate electrode 17 is positioned between the source region 14 and island region 16, while the gate electrode 18 is positioned between the island region 16 and drain region 15.

A source contact 14A is placed in the source region 14 for connecting the source region 14 to a wiring layer (not shown). A drain contact 15A is placed in the drain region 15 for connecting the drain region 15 to a wiring layer (not shown). The distance between the drain contact 15A and gate electrode 18 is longer than the distance between the source contact 14A and gate electrode 17 which are placed in conformity to a design rule.

The p-channel MOS transistors P1, P2 include an additional wiring layer (gate electrode 18) on the gate insulating film between the source and drain (defined as a gate region), connected to the ground terminal TG, as added to the p-channel MOS transistor P11 which forms part of the conventional protection circuit. Therefore, the area occupied by the source region 14, island region 16, drain region 15 and channels of the p-MOS transistors P1, P2 is as wide as the area occupied by the source region 104, drain region 105 and channel of the conventional p-MOS transistor P11, without requiring a larger area, as compared with the conventional p-MOS transistor P11, for forming the p-MOS transistors P1, P2.

In the p-channel MOS transistors P1, P2 formed in the foregoing manner, under the condition that the power supply terminal TV is connected to the power supply potential Vcc with the ground terminal TG being left in floating state, when static electricity having a minus potential, applied to an input terminal or an output terminal, introduces into the gate electrode 18 in floating state, the gate electrode 18 is excited to the minus potential to form a channel in a portion of the gate region between the source region 14 and the drain region 15, so that the apparent transistor channel length becomes shorter than that of the conventional protection element (the p-MOS transistor P11). In this way, the charge, which has introduced into the ground terminal TG by the application of the static electricity having the minus potential, can be readily led to the power supply potential Vcc through the power supply terminal TV, thereby making it possible to obviate the internal elements from being broken by the static electricity.

Next described will be the configuration of n-channel MOS transistors.

Figure 3A:
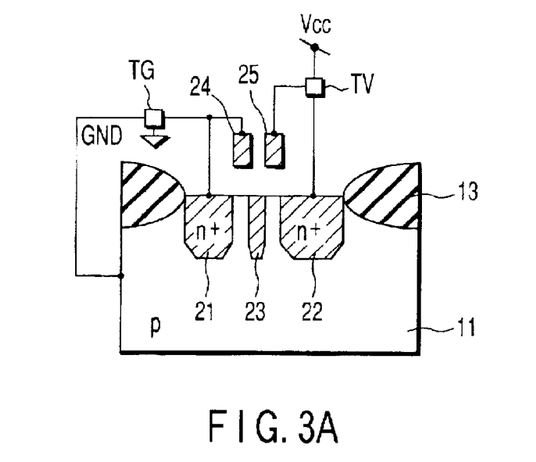
FIG. 3A is a schematic cross-sectional view of n-channel MOS transistors which form part of the protection circuit according to the first embodiment of this invention.
Figure 3B:
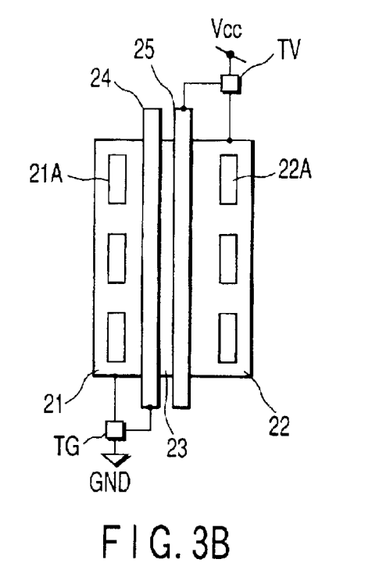
FIG. 3B illustrates a layout of the n-channel MOS transistors, forming part of the protection circuit according to the first embodiment, on the semiconductor substrate.

FIG. 3A is a schematic cross-sectional view of the n-channel MOS transistors which comprise the protection circuit according to the first embodiment. FIG. 3B illustrates a layout of the n-channel MOS transistors on a semiconductor substrate.

As illustrated in FIG. 3A, an element region, separated by an element separation insulating film 13, is formed within a p-type silicon semiconductor substrate 11. A source region ($n^+$-type) 21 and a drain region ($n^+$-type) 22 are formed spaced apart by a predetermined distance within the p-type substrate 11 in the element region. A floating island region ($n^+$-type) 23, isolated from the source region 21 and drain region 22, is formed between the source region 21 and drain region 22.

A gate electrode 24 is formed on a channel between the source region 21 and island region 23, with a gate insulating film (not shown) therebetween. A gate electrode 25 is formed on a channel between the island region 23 and drain region 22, with a gate insulating film (not shown) therebetween.

An n-MOS transistor N1 is formed of the foregoing source region 21, island region 23, channel between the source region 21 and island region 23, and gate electrode 24 on the channel. Also, an n-MOS transistor N2 is formed of the island region 23, drain region 22, channel between the island region 23 and drain region 22, and gate electrode 25 on the channel.

The ground terminal TG, supplied with the ground potential, is connected to the source region 21, gate electrode 24 and p-type substrate 11 of the n-MOS transistor N1. The power supply terminal TV, supplied with the power supply potential Vcc, is connected to the drain region 22 and gate electrode 25 of the n-MOS transistor N2.

The n-channel MOS transistors N1, N2 are laid out on the semiconductor substrate as illustrated in FIG. 3B. The source region 21, island region 23, and drain region 22, comprising the n-MOS transistors N1, N2, are positioned separately from one another. The gate electrode 24 is positioned between the source region 21 and island region 23, while the gate electrode 25 is positioned between the island region 23 and drain region 22.

A source contact 21A is placed in the source region 21 for connecting the source region 21 to a wiring layer (not shown). A drain contact 22A is placed in the drain region 22 for connecting the drain region 22 to a wiring layer (not shown). The distance between the drain contact 22A and gate electrode 25 is longer than the distance between the source contact 21A and gate electrode 24 which are positioned in conformity to the design rule.

The n-channel MOS transistors N1, N2 include the additional wiring layer (gate electrode 25) connected to the power supply terminal TV on the gate insulating film between the source and drain (defined as the gate region), as added to the n-channel MOS transistor N11 which forms part of the conventional protection circuit. Therefore, the area occupied by the source region 21, island region 23, drain region 22, and channels of the n-MOS transistors N1, N2 is as wide as the area occupied by the source region 121, drain region 122, and channel of the conventional n-MOS transistor N11, without requiring a larger area, as compared with the conventional n-MOS transistor N11, for forming the n-MOS transistors N1, N2.

In the n-MOS transistors N1, N2 formed in the foregoing manner, under the condition that the ground terminal TG is connected to the ground potential GND with the power supply terminal TV being left in floating state, when static electricity having a plus potential, applied to the input terminal or output terminal, introduces into the gate electrode 25 in floating state, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into the power supply terminal TV by the application of the static electricity having the plus potential, can be readily led to the ground potential GND through the ground terminal TG, thereby making it possible to obviate the internal elements from being broken by the static electricity.

Next described will be the protection circuit according to the first embodiment which comprises the p-channel MOS transistors P1, P2 and n-channel MOS transistors N1, N2.

Figure 4A:
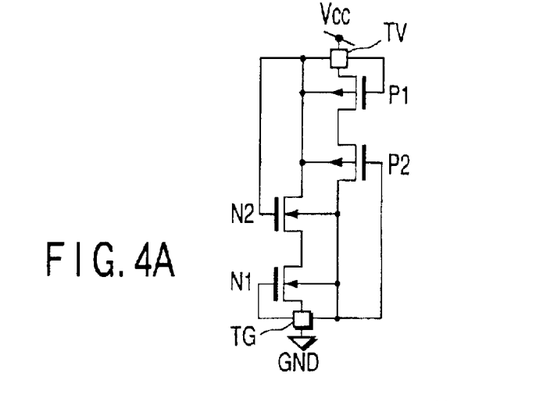
FIG. 4A is a circuit diagram illustrating the configuration of the protection circuit according to the first embodiment of this invention.
Figure 4B:
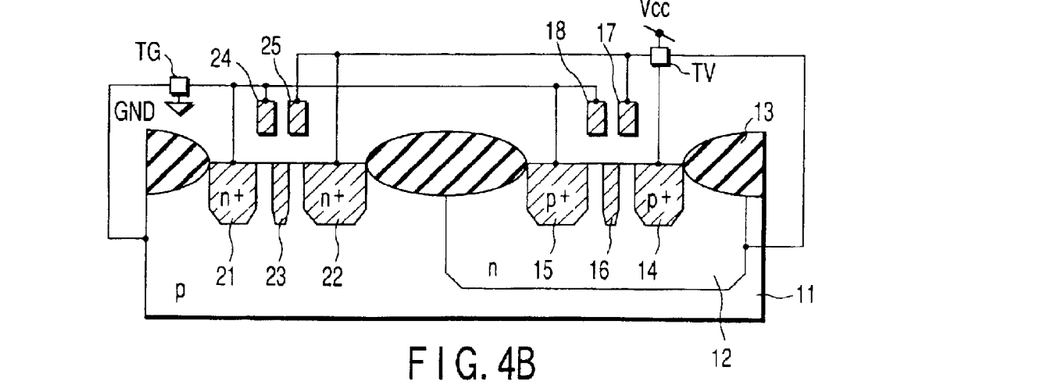
FIG. 4B is a schematic cross-sectional view of the protection circuit according to the first embodiment.
Figure 4C:
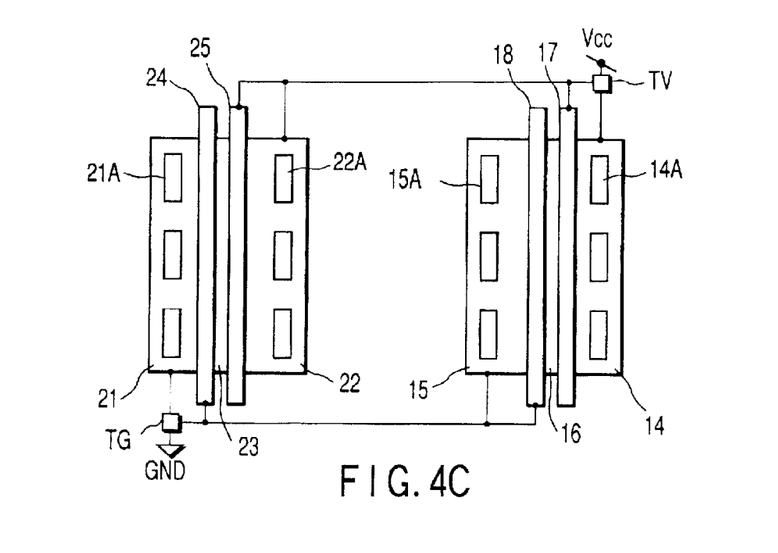
FIG. 4C illustrates a layout of the protection circuit according to the first embodiment on a semiconductor substrate.

FIG. 4A is a circuit diagram illustrating the protection circuit according to the first embodiment; FIG. 4B is a schematic cross-sectional view of the protection circuit; and FIG. 4C illustrates a layout of the protection circuit on a semiconductor substrate.

As illustrated in FIG. 4A, this protection circuit comprises the p-channel MOS transistors P1, P2, and n-channel MOS transistors N1, N2.

The p-channel MOS transistor P1 has the source, gate, and back gate connected to the power supply terminal TV which is supplied with the power supply potential Vcc. The p-MOS transistor P1 has the drain connected to the source of the p-MOS transistor P2. The p-MOS transistor P2 has a back gate connected to the power supply terminal TV, and the drain and gate connected to the ground terminal TG which is supplied with the ground potential GND.

The n-MOS transistor N1 has the source, gate and back gate connected to the ground terminal TG. The n-MOS transistor N1 has the drain connected to the source of the n-MOS transistor N2. The n-MOS transistor N2 has the drain and gate connected to the power supply terminal TV, and its back gate connected to the ground terminal TG.

As can be seen from FIG. 4B, the general structure of the protection circuit in cross-section includes the p-MOS transistors P1, P2 illustrated in FIG. 2 and the n-MOS transistors N1, N2 illustrated in FIG. 3A, which are positioned adjacent to each other, with the power supply terminal TV and ground terminal TG used common to them.

The layout of the protection circuit on the semiconductor substrate, as illustrated in FIG. 4C, includes the p-MOS transistors P1, P2 illustrated in FIG. 2B and the n-MOS transistors N1, N2 illustrated in FIG. 3B, which are positioned adjacent to each other, with the power supply terminal TV and ground terminal TG used common to them.

The protection circuit according to the first embodiment is connected between a power supply line supplied with the power supply potential Vcc and a ground line supplied with the ground potential GND in the semiconductor circuit for use therewith.

In the protection circuit configured in the foregoing manner, with the power supply terminal TV connected to the power supply potential Vcc and the ground terminal TG left in floating state, when static electricity having a minus potential, applied to the input terminal or output terminal, introduces into the gate electrode 18 in floating state, the gate electrode 18 is excited to the minus potential to form a channel in a portion of the gate region between the source region 14 and the drain region 15, so that the apparent transistor channel length becomes shorter than that of the conventional protection element (the p-MOS transistor P11), as described above. In this way, the charge, which has introduced into the ground terminal TG by the application of the static electricity having the minus potential, can be readily led to the power supply potential Vcc through the power supply terminal TV, thereby making it possible to obviate the internal elements from being broken by the static electricity.

On the other hand, with the ground terminal TG connected to the ground potential GND and the power supply terminal TV being left in floating state, when static electricity having a plus potential, applied to the input terminal or output terminal, introduces into the gate electrode 25 in floating state, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into the power supply terminal TV by the application of the static electricity having the plus potential, can be readily led to the ground potential GND through the ground terminal TG, thereby making it possible to obviate the internal elements from being broken by the static electricity.

Second Embodiment

Next described will be a first example in which the p-MOS transistors P1, P2 illustrated in FIGS. 2A, 2B are connected between the power supply terminal TV and an input/output terminal I/O; a second example in which the n-MOS transistors N1, N2 illustrated in FIGS. 3A, 3B are connected between the ground terminal TG and input/output terminal I/O; and a third example which is a combination of the first and second examples, as a protection circuit according to a second embodiment of this invention.

Figure 5:
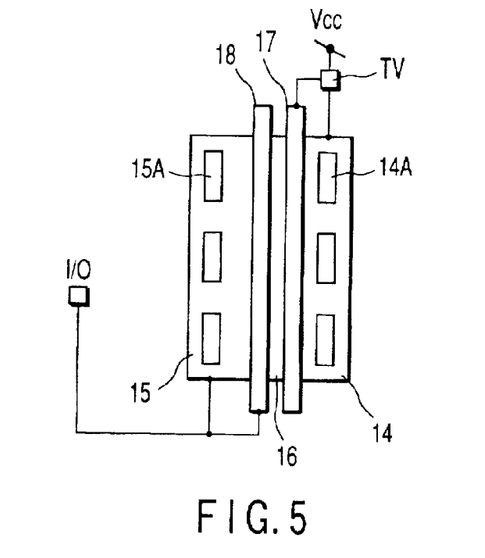
FIG. 5 is a layout on a semiconductor substrate illustrating the configuration of a protection circuit (first example) according to a second embodiment of this invention.

FIG. 5 illustrates a layout on a semiconductor substrate, illustrating the configuration of a protection circuit (first example) according to the second embodiment.

As illustrated in FIG. 5, in this protection circuit, the p-MOS transistor P1 has the source region 14, gate electrode 17, and back gate (not shown), which is an n-type well, connected to the power supply terminal TV which is supplied with the power supply potential Vcc. The p-MOS transistor P2 has the drain region 15 and gate electrode 18 connected to the input/output terminal I/O through which an input signal or an output signal is input or output. The rest of the configuration is similar to the configuration illustrated in FIG. 2B.

In the protection circuit configured in the foregoing manner, with the power supply terminal TV connected to the power supply potential Vcc, when static electricity having a minus potential, applied to the input/output terminal I/O, introduces into the gate electrode 18, the gate electrode 18 is excited to the minus potential to form a channel in a portion of the gate region between the source region 14 and the drain region 15, so that the apparent transistor channel length becomes shorter than that of the conventional protection element (the p-MOS transistor P11). In this way, the charge, which has introduced into the input/output terminal I/O by the application of the static electricity having the minus potential, can be readily led to the power supply potential Vcc through the power supply terminal TV, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

Figure 6:
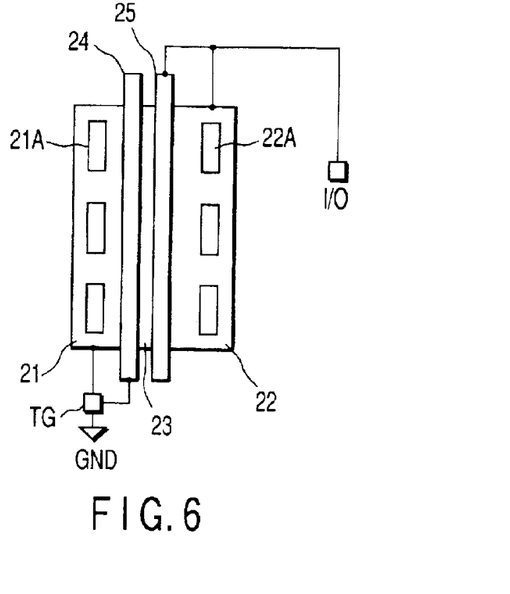
FIG. 6 is a layout on a semiconductor substrate illustrating the configuration of a protection circuit (second example) according to the second embodiment of this invention.

FIG. 6 is a layout on a semiconductor substrate, illustrating the configuration of a protection circuit (second example) according to the second embodiment.

As illustrated in FIG. 6, in this protection circuit, the n-MOS transistor N1 has the source region 21, gate electrode 24 and back gate (not shown), which is the p-type substrate, connected to the ground terminal TG which is supplied with the ground potential. The n-MOS transistor N2 has the drain region 22 and gate electrode 25 connected to the input/output terminal I/O through which an input signal or an output signal is input or output. The rest of the configuration is similar to the configuration illustrated in FIG. 3B.

In the protection circuit configured in the foregoing manner, with the ground terminal TG connected to the ground potential GND, when static electricity having a plus potential, applied to the input/output terminal I/O, introduces into the gate electrode 25, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into the input/output terminal I/O by the application of the static electricity having the plus potential, can be readily led to the ground potential GND through the ground terminal TG, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

Figures 7A, 7C:
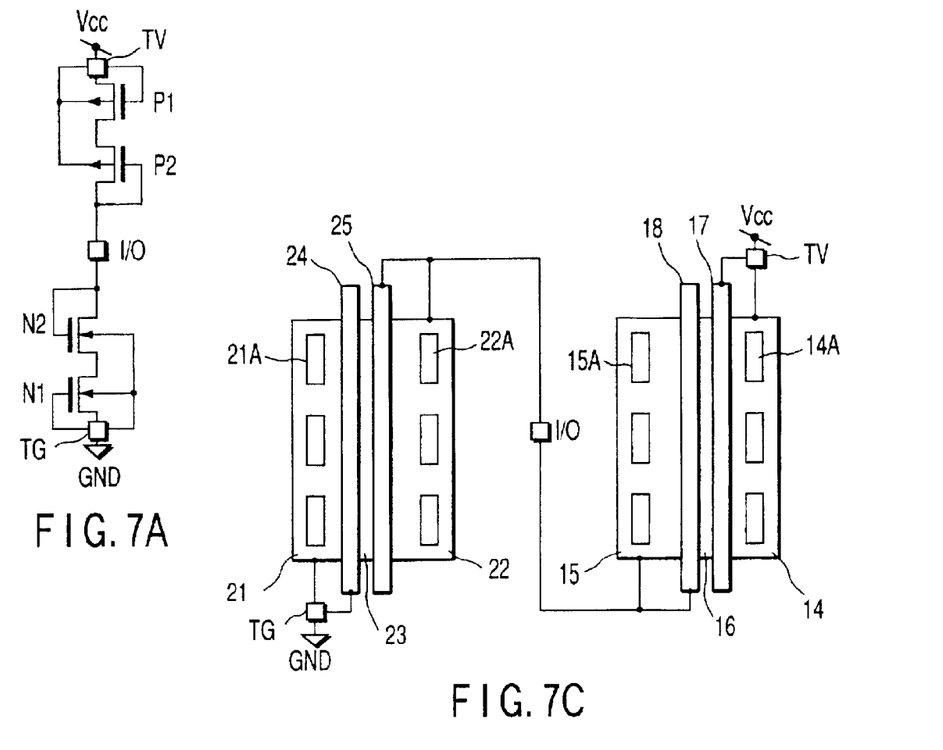
FIG. 7A is a circuit diagram illustrating a protection circuit (third example) according to the second embodiment of this invention.
FIG. 7C illustrates a layout on a semiconductor substrate of the protection circuit according to the second embodiment.
Figure 7B:
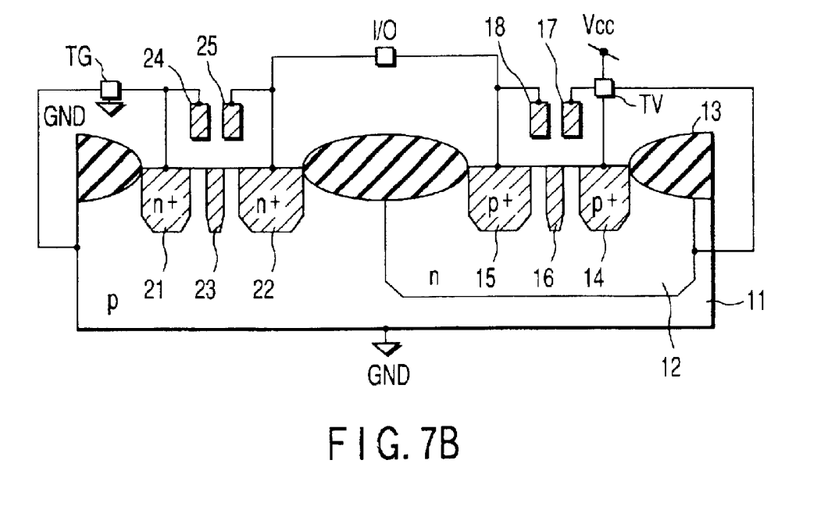
FIG. 7B is a schematic cross-sectional view of the protection circuit according to the second embodiment.

FIG. 7A is a circuit diagram illustrating a protection circuit (third example) according to the second embodiment; FIG. 7B is a schematic cross-sectional view of the protection circuit; and FIG. 7C illustrates a layout of the protection circuit on the semiconductor substrate.

As illustrated in FIG. 7A, the protection circuit comprises the p-channel MOS transistors P1, P2 and n-channel MOS transistors N1, N2.

The p-MOS transistor P1 has the source, gate, and back gate connected to the power supply terminal TV which is supplied with the power supply potential Vcc. The p-MOS transistor P1 has the drain connected to the source of the p-MOS transistor P2. The p-MOS transistor P2 has the back gate connected to the power supply terminal TV, and the drain and gate connected to the input/output terminal I/O through which an input signal or an output signal is input or output.

The n-MOS transistor N1 has the source, gate, and back gate connected to the ground terminal TG which is supplied with the ground potential GND. The n-MOS transistor N1 has the drain connected to the source of the n-MOS transistor N2. The n-MOS transistor N2 has the drain and gate connected to the input/output terminal I/O, and the back gate connected to the ground terminal TG.

As illustrated in FIG. 7B, the general structure of the protection circuit in cross-section includes the p-MOS transistors P1, P2 illustrated in FIG. 2A and the n-MOS transistors N1, N2 illustrated in FIG. 3A, which are positioned adjacent to each other. These transistors are connected to the power supply terminal TV, ground terminal TG, and input/output terminal I/O in the following manner.

The p-MOS transistor P1 has the source region 14, gate electrode 17, and n-type well 12 connected to the power supply terminal TV which is supplied with the power supply potential Vcc. The p-MOS transistor P2 has the drain region 15 and gate electrode 18 connected to the input/output terminal I/O through which an input signal or an output signal is input or output.

The n-MOS transistor N1 has the source region 21, gate electrode 24, and n-type substrate 11 connected to the ground terminal TG which is supplied with the ground potential GND. The n-MOS transistor N2 has the drain region 22 and gate electrode 25 connected to the input/output terminal I/O.

As illustrated in FIG. 7C, the protection circuit is laid out on the semiconductor substrate such that the p-MOS transistors P1, P2 illustrated in FIG. 2B are positioned adjacent to the n-MOS transistors N1, N2 illustrated in FIG. 3B. These transistors are connected to the power supply terminal TV, ground terminal TG, and input/output terminal I/O in the manner described in connection with the structure illustrated in the cross-sectional view of FIG. 7B.

In the protection circuit configured in the foregoing manner, with the power supply terminal TV connected to the power supply potential Vcc and the ground terminal TG connected to the ground potential GND, when static electricity having a minus potential, applied to the input/output terminal I/O, introduces into the gate electrode 18, the gate electrode 18 is excited to the minus potential to form a channel in a portion of the gate region between the source region 14 and the drain region 15, so that the apparent transistor channel length becomes shorter than that of the conventional protection element (the p-MOS transistor P11). In this way, the charge, which has introduced into the input/output terminal I/O by the application of the static electricity having the minus potential, can be readily led to the power supply potential Vcc through the power supply terminal TV, thereby making it possible to obviate the internal elements from being broken by the static electricity.

On the other hand, when static electricity having a plus potential, applied to the input/output terminal I/O, introduces into the gate electrode 25, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into input/output terminal I/O by the application of the static electricity having the plus potential, can be readily led to the ground potential GND through the ground terminal TG, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

Third Embodiment

Next, described will be a first example in which the p-MOS transistors P1, P2 illustrated in FIGS. 2A, 2B are connected to the input/output terminal I/O, ground terminal TG, and the power supply terminal TV; a second example in which the n-MOS transistors N1, N2 illustrated in FIGS. 3A, 3B are connected to the input/output terminal I/O, ground terminal TG, and power supply terminal TV; and a third example which is a combination of the first and second examples, as a protection circuit according to a third embodiment of this invention.

Figure 8:
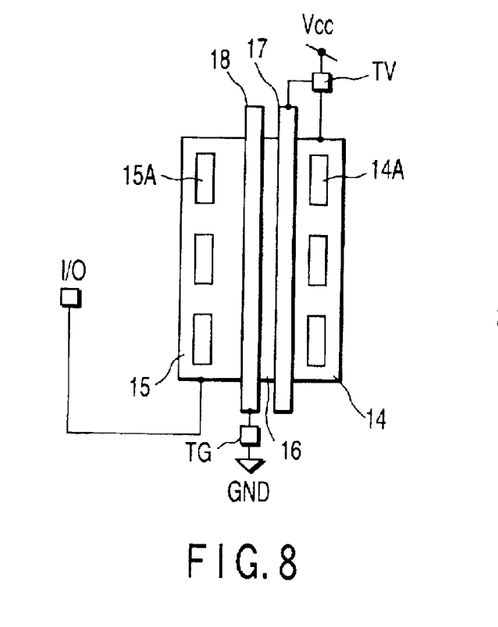
FIG. 8 is a layout on a semiconductor substrate illustrating the configuration of a protection circuit (first example) according to a third embodiment of this invention.

FIG. 8 illustrates a layout on a semiconductor substrate, illustrating the configuration of a protection circuit (first example) according to the third embodiment.

As illustrated in FIG. 8, in this protection circuit, the p-MOS transistor P1 has the source region 14, gate electrode 17, and pack gate (not shown), which is an n-type well, connected to the power supply terminal TV supplied with the power supply potential Vcc. The p-MOS transistor P2 has the gate electrode 18 connected to the ground terminal TG which is supplied with the ground potential GND. The p-MOS transistor P2 has the drain region 15 connected to the input/output terminal I/O for inputting an input signal or outputting an output signal. The rest of the configuration is similar to the configuration illustrated in FIG. 2B.

In the p-channel MOS transistors P1, P2 formed in the foregoing manner, under the condition that the power supply terminal TV is connected to the power supply potential Vcc with the ground terminal TG being left in floating state, when static electricity having a minus potential, applied to an input terminal or an output terminal, introduces into the gate electrode 18 in floating state, the gate electrode 18 is excited to the minus potential to form a channel in a portion of the gate region between the source region 14 and the drain region 15, so that the apparent transistor channel length becomes shorter than that of the conventional protection element (the p-MOS transistor P11). In this way, the charge, which has introduced into the ground terminal TG by the application of the static electricity having the minus potential, can be readily led to the power supply potential Vcc through the power supply terminal TV, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

Figure 9:
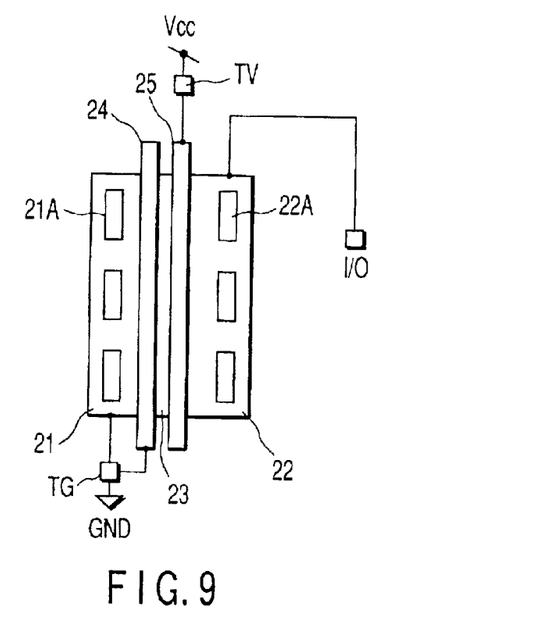
FIG. 9 is a layout on a semiconductor substrate illustrating the configuration of a protection circuit (second example) according to the third embodiment of this invention.

FIG. 9 is a layout on the semiconductor substrate illustrating the configuration of a protection circuit (second example) according to the third embodiment.

As illustrated in FIG. 9, in this protection circuit, the n-MOS transistor N1 has the source region 21, gate electrode 24 and back gate (not shown), which is the p-type substrate, connected to the ground terminal TG which is supplied with the ground potential. The n-MOS transistor N2 has the gate electrode 25 connected to the power supply terminal TV supplied with the power supply potential Vcc. The n-MOS transistor N2 has the drain region 22 connected to the input/output terminal I/O through which an input signal or an output signal is input or output. The rest of the configuration is similar to the configuration illustrated in FIG. 3B.

In the n-channel MOS transistors N1, N2 formed in the foregoing manner, under the condition that the ground terminal TG is connected to the ground potential GND with the power supply terminal TV being left in floating state, when static electricity having a plus potential, applied to the input terminal or output terminal, introduces into the gate electrode 25 in floating state, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into the power supply terminal TV by the application of the static electricity having the plus potential, can be readily led to the ground potential GND through the ground terminal TG, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

Figure 10A:
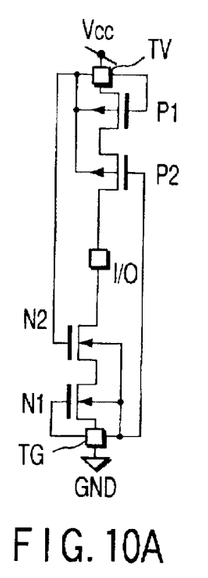
FIG. 10A is a circuit diagram illustrating the configuration of a protection circuit (third example) according to the third embodiment of this invention.
Figure 10B:
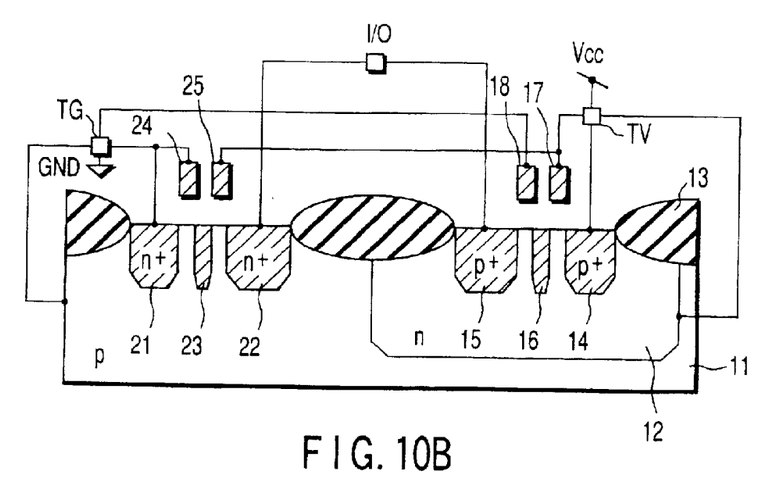
FIG. 10B is a schematic cross-sectional view of the protection circuit according to the third embodiment.
Figure 10C:
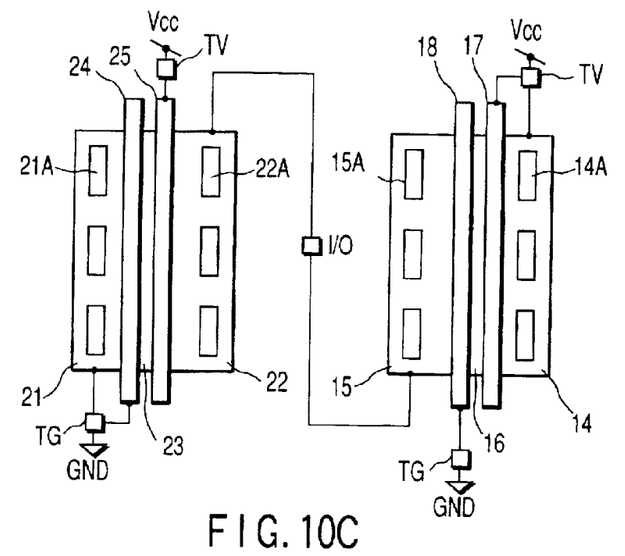
FIG. 10C illustrates a layout on a semiconductor substrate of the protection circuit according to the third embodiment.

FIG. 10A is a circuit diagram illustrating the configuration of a protection circuit (third example) according to the third embodiment; FIG. 10B is a schematic cross-sectional view of the protection circuit; and FIG. 10C illustrates a layout of the protection circuit on the semiconductor substrate.

As illustrated in FIG. 10A, this protection circuit comprises the p-channel MOS transistors P1, P2 and n-channel MOS transistors N1, N2.

The p-MOS transistor P1 has the source, gate and back gate connected to the power supply terminal TV which is supplied with the power supply potential Vcc. The p-MOS transistor P1 has the drain connected to the source of the p-MOS transistor P2. The p-MOS transistor P2 has the back gate connected to the power supply potential TV, and the gate connected to the ground terminal TG which is supplied with the ground potential GND.

The n-MOS transistor N1 has the source, gate and back gate connected to the ground terminal TG. The n-MOS transistor N1 has the drain connected to the source of the n-MOS transistor N2. The n-MOS transistor N2 has the gate connected to the power supply terminal TV, and the back gate connected to the ground terminal TG.

Further, the drain of the p-MOS transistor P2 and the drain of the n-MOS transistor N2 are connected to the input/output terminal I/O through which an input signal or an output signal are input or output.

As illustrated in FIG. 10B, the general structure of the protection circuit in cross-section includes the p-MOS transistors P1, P2 illustrated in FIG. 2A and the n-MOS transistors N1, N2 illustrated in FIG. 3A, which are positioned adjacent to each other. These transistors are connected to the power supply terminal TV, ground terminal TG, and input/output terminal I/O in the following manner.

The source region 14, gate electrode 17 and n-type well 12 of the p-MOS transistor P1, and the gate electrode 25 of the n-MOS transistor N2 are connected to the power supply terminal TV which is supplied with the power supply potential Vcc. The source region 21, gate electrode 24 and p-type substrate 11 of the n-MOS transistor N1, and the gate electrode 18 of the p-MOS transistor P2 are connected to the ground terminal TG which is supplied with the ground potential GND. The drain region 15 of the p-MOS transistor P2 and the drain region 22 of the n-MOS transistor N2 are connected to the input/output terminal I/O through which an input signal or an output signal is input or output.

As illustrated in FIG. 10C, the protection circuit is laid out on the semiconductor substrate such that the p-MOS transistors P1, P2 illustrated in FIG. 2B are positioned adjacent to the n-MOS transistors N1, N2 illustrated in FIG. 3B. These transistors are connected to the power supply terminal TV, ground terminal TG, and input/output terminal I/O in the manner as described in connection with the structure illustrated in the cross-sectional view of FIG. 10B.

In the p-channel MOS transistors P1, P2 formed in the foregoing manner, under the condition that the power supply terminal TV is connected to the power supply potential Vcc with the ground terminal TG being left in floating state, when static electricity having a minus potential, applied to an input terminal or an output terminal, introduces into the gate electrode 18 in floating state, the gate electrode 18 is excited to the minus potential to form a channel in a portion of the gate region between the source region 14 and the drain region 15, so that the apparent transistor channel length becomes shorter than that of the conventional protection element (the p-MOS transistor P11). In this way, the charge, which has introduced into the ground terminal TG by the application of the static electricity having the minus potential, can be readily led to the power supply potential Vcc through the power supply terminal TV, thereby making it possible to obviate the internal elements from being broken by the static electricity.

In the n-channel MOS transistors N1, N2 formed in the foregoing manner, under the condition that the ground terminal TG is connected to the ground potential GND with the power supply terminal TV being left in floating state, when static electricity having a plus potential, applied to the input terminal or output terminal, introduces into the gate electrode 25 in floating state, the gate electrode 25 is excited to the plus potential to form a channel in a portion of the gate region between the source region 21 and the drain region 22, so that the apparent transistor channel length becomes shorter than that of the conventional protection element (the n-MOS transistor N11). In this way, the charge, which has introduced into the power supply terminal TV by the application of the static electricity having the plus potential, can be readily led to the ground potential GND through the ground terminal TG, thereby making it possible to obviate the internal elements from being broken by the static electricity.

It should be noted that the foregoing description has been made for the input/output terminal I/O taken as an example, the same is applied to an input terminal dedicated to receipt of signal or to an output terminal dedicated to delivery of signal.

As described above, according to the foregoing embodiments of this invention, it is possible to provide a protection circuit which is capable of improving the tolerance of a semiconductor circuit to static electricity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A protection circuit comprising:
   a power supply terminal supplied with a power supply potential;
   a reference terminal supplied with a reference potential;
   a first p-channel MOS transistor having a first gate, a first source, a first drain and a first back gate, said first gate, said first source and said first back gate being connected to said power supply terminal;

a second p-channel MOS transistor having a second gate, a second source, a second drain and said first back gate, said second source of said second p-channel MOS transistor being connected to said first drain of said first p-channel MOS transistor, said second gate and said second drain of said second p-channel MOS transistor being connected to said reference terminal;

a first n-channel MOS transistor having a third gate, a third source, a third drain and a second back gate, said third gate, said third source and said second back gate of said first n-channel MOS transistor being connected to said reference terminal; and a second n-channel MOS transistor having a fourth gate, a fourth source, a fourth drain and said second back gate, said fourth source of said second n-channel MOS transistor being connected to said third drain of said first n-channel MOS transistor, said fourth gate and said fourth drain of said second n-channel MOS transistor being connected to said power supply terminal.

2. A protection circuit according to claim 1, wherein said protection circuit is provided for a semiconductor circuit formed on a semiconductor substrate, wherein said power supply terminal is connected to a power supply line which is supplied with a power supply potential within said semiconductor circuit, and said reference potential is connected to a ground line which is supplied with a ground potential within said semiconductor circuit.

3. A protection circuit comprising:

a power supply terminal supplied with a power supply potential;

an input/output terminal inputting and outputting a signal therethrough;

a first p-channel MOS transistor having a first gate, a first source, a first drain and a first back gate, said first gate, said first source and said first back gate being connected to said power supply terminal; and a second p-channel MOS transistor having a second gate, a second source, a second drain and said first back gate, said second source of said second p-channel MOS transistor being connected to said first drain of said first p-channel MOS transistor, said second gate and said second drain of said second p-channel MOS transistor being connected to said input/output terminal.

4. A protection circuit according to claim 3, further comprising a reference terminal supplied with a reference potential;

a first n-channel MOS transistor having a third gate, a third source, a third drain and a second back gate, said third gate, said third source and said second back gate of said first n-channel MOS transistor being connected to said reference terminal; and a second n-channel MOS transistor having a fourth gate, a fourth source, a fourth drain and said second back gate, said fourth source of said second n-channel MOS transistor being connected to said third drain of said first n-channel MOS transistor, said fourth gate and said fourth drain of said second n-channel MOS transistor being connected to said input/output terminal.

5. A protection circuit according to claim 3, wherein when said input/output terminal is applied with static electricity having a minus potential, said second gate of said second p-channel MOS transistor is supplied with said minus potential to form a channel between said second source and said second drain of said second p-channel MOS transistor.

6. A protection circuit comprising:

a reference terminal supplied with a reference potential;

an input/output terminal inputting and outputting a signal therethrough;

a first n-channel MOS transistor having a first gate, a first source, a first drain and a back gate, said first gate, said first source and said back gate being connected to said reference terminal; and a second n-channel MOS transistor having a second gate, a second source, a second drain and said back gate, said second source of said second n-channel MOS transistor being connected to said first drain of said first n-channel transistor, and said second gate and said second drain of said second n-channel MOS transistor being connected to said input/output terminal.

7. A protection circuit according to claim 6, wherein when said input/output terminal is applied with static electricity having a plus potential, said second gate of said second n-channel MOS transistor is supplied with said plus potential to form a channel between said second source and said second drain of said second n-channel MOS transistor.

8. A protection circuit comprising:

a power supply terminal supplied with a power supply potential;

a reference terminal supplied with a reference potential;

an input/output terminal inputting and outputting a signal therethrough;

a first p-channel MOS transistor having a first gate, a first source, a first drain and a first back gate, said first gate, said first source and said first back gate being connected to said power supply terminal;

a second p-channel MOS transistor having a second gate, a second source, a second drain and said first back gate, said second source of said second p-channel MOS transistor being connected to said first drain of said first p-channel MOS transistor, said second gate of said second p-channel MOS transistor being connected to said reference terminal, said second drain of said second p-channel MOS transistor being connected to said input/output terminal;

a first n-channel transistor having a third gate, a third source, a third drain and a second back gate, said third gate, said third source and said second back gate of said first n-channel transistor being connected to said reference terminal; and a second n-channel MOS transistor having a fourth gate, a fourth source, a fourth drain and said second back gate, said fourth source of said second n-channel MOS transistor being connected to said third drain of said first n-channel MOS transistor, said fourth gate of said second n-channel MOS transistor being connected to said power supply terminal, said fourth drain of said second n-channel MOS transistor being connected to said input/output terminal.

9. A protection circuit according to claim 8, wherein said second gate of said second n-channel MOS transistor is supplied with said power supply potential to form a channel between said second source and said second drain of said second n-channel MOS transistor.

* * * * *